United States Patent
Mallela et al.

(10) Patent No.: US 9,601,491 B1
(45) Date of Patent: Mar. 21, 2017

(54) VERTICAL FIELD EFFECT TRANSISTORS HAVING EPITAXIAL FIN CHANNEL WITH SPACERS BELOW GATE STRUCTURE

(71) Applicant: INTERNATIONAL BUSINESS MACHINES CORPORATION, Armonk, NY (US)

(72) Inventors: Hari V. Mallela, Poughquag, NY (US); Reinaldo A. Vega, Mahopac, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/146,455

(22) Filed: May 4, 2016

Related U.S. Application Data

(62) Division of application No. 15/009,179, filed on Jan. 28, 2016.

(51) Int. Cl.
*H01L 27/092* (2006.01)
*H01L 29/423* (2006.01)
(Continued)

(52) U.S. Cl.
CPC .. *H01L 27/0922* (2013.01); *H01L 21/823807* (2013.01); *H01L 21/823842* (2013.01);
(Continued)

(58) Field of Classification Search
CPC ....... H01L 2924/13067; H01L 27/0886; H01L 27/0924; H01L 27/10826; H01L 27/10879;
(Continued)

(56) References Cited

U.S. PATENT DOCUMENTS

| | | |
|---|---|---|
| 6,294,418 B1 | 9/2001 | Noble |
| 6,580,124 B1 | 6/2003 | Cleeves et al. |

(Continued)

OTHER PUBLICATIONS

Larrieu, et al., "Vertical Nanowire Array-based Field Effect Transistors for Ultimate Scaling", Nanoscale, This journal is The Royal Society of Chemistry, Jan. 2013, pp. 2437-2441.
(Continued)

*Primary Examiner* — Michael Jung
(74) *Attorney, Agent, or Firm* — Tutunjian & Bitetto, P.C.; Vazken Alexanian

(57) ABSTRACT

A method of fabricating a vertical field effect transistor comprising that includes forming openings through a spacer material to provide fin structure openings to a first semiconductor material, and forming an inner spacer liner on sidewalls of the fin structure openings. A channel semiconductor material is epitaxially formed on a surface of the first semiconductor material filling at least a portion of the fin structure openings. The spacer material is recessed with an etch that is selective to the inner spacer liner to form a first spacer. The inner spacer liner is removed selectively to the channel semiconductor material. A gate structure on the channel semiconductor material, and a second semiconductor material is formed in contact with the channel semiconductor material.

20 Claims, 10 Drawing Sheets

(51) Int. Cl.
  *H01L 29/786* (2006.01)
  *H01L 29/06* (2006.01)
  *H01L 21/8238* (2006.01)
(52) U.S. Cl.
  CPC ............ *H01L 21/823857* (2013.01); *H01L 21/823878* (2013.01); *H01L 21/823885* (2013.01); *H01L 29/0653* (2013.01); *H01L 29/42392* (2013.01); *H01L 29/78642* (2013.01); *H01L 29/78696* (2013.01); *H01L 2029/42388* (2013.01)
(58) Field of Classification Search
  CPC ........... H01L 27/1211; H01L 29/41791; H01L 29/66795; H01L 29/785; H01L 29/7855
  See application file for complete search history.

(56) References Cited

U.S. PATENT DOCUMENTS

| | | | |
|---|---|---|---|
| 7,683,428 B2 | 3/2010 | Chidambarrao et al. | |
| 7,948,027 B1* | 5/2011 | Renn | H01L 21/84 257/329 |
| 7,993,999 B2 | 8/2011 | Basker et al. | |
| 8,274,110 B2* | 9/2012 | Sandhu | H01L 27/2463 257/329 |
| 8,637,849 B2 | 1/2014 | Deligianni et al. | |
| 9,087,897 B1 | 7/2015 | Anderson et al. | |
| 2015/0357432 A1* | 12/2015 | Lin | H01L 29/66439 257/24 |
| 2015/0380548 A1* | 12/2015 | Wang | H01L 29/7827 257/329 |
| 2016/0064541 A1* | 3/2016 | Diaz | H01L 29/66666 257/329 |

OTHER PUBLICATIONS

Shen, et al., "Vertical GAA Silicon Nanowire Transistor with Impact of Temperature on Device Parameters", World Academy of Science, Engineering and Technology, International Scholarly and Scientific Research & Innovation, Nov. 2010, pp. 944-947, vol. 4.

* cited by examiner

VERTICAL FIELD EFFECT TRANSISTORS HAVING EPITAXIAL FIN CHANNEL WITH SPACERS BELOW GATE STRUCTURE

BACKGROUND

Technical Field

The present disclosure relates to methods of forming vertical finFET devices and the electronic device structures produced thereby, and more particularly to a method of epitaxially forming the drain, channel, and source of a vertical finFET.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and FinFETs have been formed with the channel extending outward from the substrate, but where the current flows vertically, as compared to a MOSFET with a single planar gate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are connected in series.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of fabricating a vertical field effect transistor includes forming a low-k spacer material on a first semiconductor material for a first of a source region and a drain region. Openings may be formed through the low-k spacer material to provide fin structure openings to the first semiconductor material. An inner spacer liner is then formed on sidewalls of the fin structure openings, wherein a surface of the first semiconductor material remains exposed. Channel semiconductor material is then epitaxially formed on the surface of the first semiconductor material. The low-k spacer material is then recessed with an etch that is selective to the inner spacer liner to form the first low-k spacer. The inner spacer liner is removed selectively to the channel semiconductor material. A gate structure is formed on the channel semiconductor material. A second low-k spacer is formed on the gate structure. A second semiconductor material for a second of the source region and the drain region is formed in contact with the channel semiconductor material.

In another embodiment, the method of fabricating the vertical field effect transistor includes forming a first spacer material on a first semiconductor material for a first of a source region and a drain region. Openings can then be formed through the first spacer material to provide fin structure openings to the first semiconductor material. An inner spacer liner is then formed on sidewalls of the fin structure openings, wherein a surface of the first semiconductor material remains exposed. Channel semiconductor material is then epitaxially formed on the surface of the first semiconductor material. The first spacer material is then recessed with an etch that is selective to the inner spacer liner to form a first portion of the first spacer. The inner spacer liner is removed selectively to the channel semiconductor material, wherein a portion of the inner spacer liner remains to provide a second portion of the first spacer that is present between the first portion of the first spacer and the channel semiconductor material. A gate structure is formed on the channel semiconductor material. A second spacer is formed on the gate structure. A second semiconductor material for a second of the source region and the drain region is formed in contact with the channel semiconductor material.

In another embodiment, a vertical semiconductor device is provided that includes a first semiconductor material for a first of a source region and a drain region and an epitaxial fin channel atop a first channel interface portion of a surface the first semiconductor material. A first spacer also contacts the surface of the first semiconductor material, wherein the first spacer comprises a low-k portion and an inner spacer portion, the inner spacer present between the low-k portion and the epitaxial fin channel. A gate structure is present atop the first spacer and is in direct contact with the epitaxial fin channel. A second spacer is formed atop the gate structure, wherein a portion the epitaxial fin channel is exposed by the second spacer to provide a second channel interface portion. A second semiconductor material for a second of the source region and the drain region is formed atop the second spacer and is in contact with the second channel interface portion of the epitaxial fin channel.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
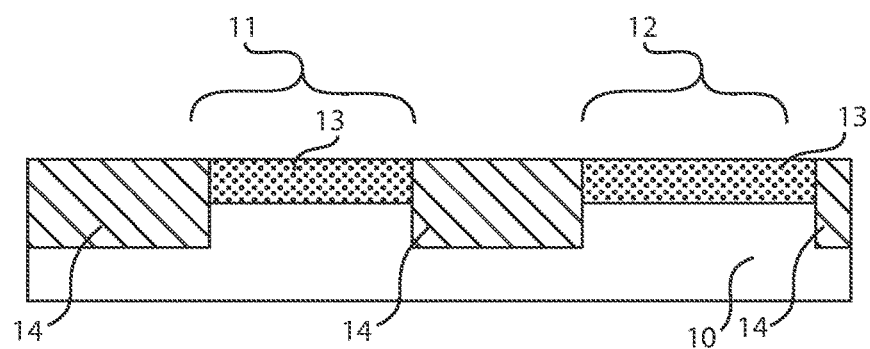
FIG. 1 is a side cross-sectional view of a substrate that has been etched to provide device regions of semiconductor material having a dielectric cap that are separated by an isolation region, in accordance to with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. The source and drain regions of the fin structure are the portions of the fin structure that are on opposing sides of the channel region of the fin structure.

In an embodiment, a finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

In one or more embodiments, a source, drain, and channel of a finFET are grown epitaxially on a crystalline substrate. In various embodiments, a source or drain is formed epitaxially directly on the substrate and the a fin channel is epitaxially formed directly on the source or drain, where the substrate, drain, fin channel, and source all have the same crystal structure and orientation.

It has been determined that the current state of the art discloses how to construct vertical field effect transistors (VFETs) in a manner that increases fin exposure to erosion during bottom drain spacer recess etch. In some embodiments, the methods and structures that are disclosed herein provide for masking the fin structures, i.e., epitaxial semiconductor channel region, of the VFET during the spacer recess etch. In some embodiments, this provides a greater degree of freedom for modulating the width of the fin structure (Dfin) than previously available with prior methods of forming VFET structures. The methods and structures of the present disclosure are now discussed with more detail referring to FIGS. 1-15B.

FIG. 1 depicts a substrate 10 that has been etched to provide device regions, e.g., first device region 11 and second device region 12, of semiconductor material having a dielectric cap 13 that are separated by isolation region 14. In various embodiments, the substrate 10 may be a semiconductor. The substrate 10 may be crystalline. The substrate 10 may be primarily (i.e., with doping) of a single element, for example, silicon (Si) or germanium, (Ge), or the substrate 10 may be a compound, for example, GaAs, SiC, or SiGe. The substrate 10 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 may also have other layers forming the substrate, including high-k oxides and/or nitrides. In one or more embodiments, the substrate 10 may be a silicon wafer. In an embodiment, the substrate is a single crystal silicon wafer.

To provide the separate device regions, i.e., first device region 11 and second device region 12, the substrate may be processed using pattern and etch methods, in combination with deposition processes to form the isolation region 14. In one embodiment, a dielectric layer, which provides the dielectric cap 13, is deposited atop the substrate 10. The dielectric layer may be composed of any dielectric material, such as an oxide, nitride or oxynitride material. For example, in some embodiments, the dielectric layer that provides the dielectric cap 13 may be a nitride, such as silicon nitride. The dielectric layer may be deposited using a deposition process, such as chemical vapor deposition, plasma enhanced chemical vapor deposition (PECVD), metal organic chemical vapor deposition (MOCVD) or other like chemical vapor deposition processes. The thickness of the dielectric layer that provides the dielectric cap may vary, but can range from 5 nm to 100 nm. In some examples, the dielectric layer can have a thickness ranging from 15 nm to 30 nm.

Following deposition of the dielectric layer, the dielectric layer may be patterned and etched to form the dielectric cap 13. The dielectric cap 13 is positioned over the portions of the substrate 10 that provide the first device region 11 and the second device region 12, in which the portions of the substrate between the dielectric cap 13 may be etched to provide the trenches that contain the dielectric material that provides the isolation regions 14. The dielectric layer may be patterned using photolithography and etch process, which can begin with forming a photoresist block mask. A photoresist block mask can be produced by applying a photoresist layer, exposing the photoresist layer to a pattern of radiation, and then developing the pattern into the photoresist layer utilizing conventional resist developer. The portions of the dielectric layer that are protected by the photoresist block mask remain to provide the dielectric cap 13, and the portions of the dielectric layer that are not protected by the photoresist block mask are removed by an etch process. The etch process for removing the exposed portions of the dielectric layer in patterning the dielectric cap 13 may be an anisotropic etch, such as reactive ion etch or laser etch, or an isotropic etch, such as a wet chemical etch.

Following formation of the dielectric cap 13, the exposed portions of the substrate 5 may be etched, i.e., recessed, to form the trenches that contain the dielectric material for the isolation regions 14 and to device the first device region 11 and the second device region 12. In one embodiment, the etch process for etching the exposed surfaces of the substrate 10 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the substrate 5 is reactive ion etching (RIE). The etch process may be time until the depth of the trench for providing the isolation regions 14 has been reached.

In one or more embodiments, following recessing the exposed portions of the substrate 10, and forming the trenches separating the first device region 11 from the second device region 12, the trenches are filled with a dielectric material to provide the isolation regions 14 separating the first and second device regions 11, 12, as depicted in FIG. 1. Filling the aforementioned trenches with the dielectric material forms the isolation regions 14. The dielectric material of the isolation regions 14 may be any dielectric material including oxides, nitrides or oxynitrides. For example, when the dielectric material of the isolation region 14 is an oxide, the dielectric may be silicon oxide. The dielectric material that is deposited in the trenches to form the isolation regions 14 may be silicon oxide ($SiO_2$). In some embodiments, the dielectric material for the isolation regions 14 may be deposited using a chemical vapor deposition process, such as plasma enhanced chemical vapor deposition (PECVD). The dielectric material may be deposited to fill an entirety of the trench. In some embodiments, if the dielectric material for the isolation regions 14 overfills the trenches, a planarization process may be employed to provide that the upper surfaces of the dielectric material in the isolation regions 14 is coplanar with the upper surfaces of the dielectric cap 13, as depicted in FIG. 1. The planarization process may be provided by chemical mechanical planarization. In some embodiments, following formation of the isolation regions 14, the islands of semiconductor material that have not been etched, which provide the first and second device regions 11, 12 can have a size in the range of about 100 $nm^2$ to about 100,000 $nm^2$, or in the range of about 1,000 $nm^2$ to about 50,000 $nm^2$, or in the range of about 5,000 $nm^2$ to about 10,000 $nm^2$. The areas between the islands 220, may have dimensions in the range of about 500 nm by about 500 nm, or in the range of about 250 nm by about 250 nm, or in the range of about 100 nm by about 100 nm, or about 60 nm by about 60 nm, where the area may be square or rectangular.

Figure 2:
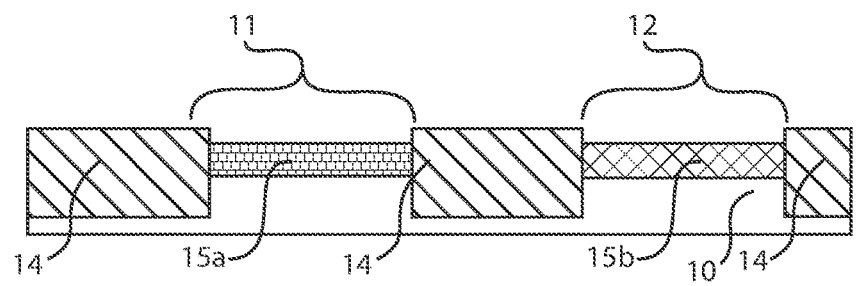
FIG. 2 is a side cross-sectional view depicting epitaxially forming a first semiconductor material in each of the device regions for at least one of a source region and a drain region, in accordance with one embodiment of the present disclosure.

FIG. 2 depicts epitaxially forming a semiconductor material (also referred to as first semiconductor material) in each of the device regions 11, 12 for at least one of a source region and a drain region. In the embodiments described with respect to the supplied figures, a drain region 15a, 15b is formed at this stage of the process, but alternative process flows have been considered in which the source region is formed at this stage of the process.

In some embodiments, forming the drain regions 15a, 15b may begin with removing the dielectric caps 13. The dielectric caps 13 may be removed by an etch that is selective to at least the semiconductor material of the first device region 11 and the second device region 12. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater. The etch process for removing the dielectric caps 13 may include a wet chemical etch, plasma etch, reactive ion etch, and combinations thereof. Following the removal of the dielectric caps 13, a recess etch may be applied to the exposed semiconductor surfaces in the first device region and the second device region. The recess etch may recess the semiconductor material by a dimension suitable for forming the drain region 15a, 15b without increasing the height of the drain region 15a, 15b to extend above the upper surface of the isolation regions 14. In some embodiments, the recess etch may be selective to the isolation region 14. In some embodiments, the recess etch is an anisotropic etch, such as reactive ion etch.

Still referring to FIG. 2, following recessing of the semiconductor substrate in the first device region 11 and the second device region 12, the drain regions 15a, 15b may be formed beginning with an epitaxial growth method. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

In some embodiments, the epitaxial semiconductor material that provides the drain regions 15a, 15b may be composed of silicon. Examples of silicon gas source for epitaxial deposition of a silicon containing drain region 15a, 15b may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, the epitaxial semiconductor material that provides the drain regions 15a, 15b may be composed of germanium. Examples of germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the drain regions 15a, 15b are composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The epitaxial semiconductor material that provides the drain regions 15a, 15b may be doped to a n-type or p-type conductivity. In the embodiment that is depicted in FIG. 2, the first drain region 15a that is depicted in the first device region 11 may be doped to an n-type conductivity, and the second drain region 15b that is depicted in the second device region 12 may be doped to a p-type conductivity. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous.

The dopant for the drain regions 15a, 15b may be introduced in-situ during the formation of the base material, i.e., epitaxial semiconductor material, of the source and drain regions 15a, 15b. The n-type gas dopant source for in-situ doping may include arsine ($AsH_3$), phosphine ($PH_3$) and alkylphosphines, such as with the empirical formula $R_x PH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source for in-situ doping may include diborane. In other embodiments, the drain region 15a, 15b may also be formed using gas phase doping or ion implantation.

In various embodiments, drain regions 15a, 15b may have a thickness in the range of about 10 nm to about 250 nm, or about 20 nm to about 150 nm, or about 50 nm to about 100 nm. The dopant concentration within <5 nm of the drain upper surface may be essentially free (i.e., approximately zero concentration) to enable channel epitaxial growth on the exposed surface of the drain 400.

Figure 3A:
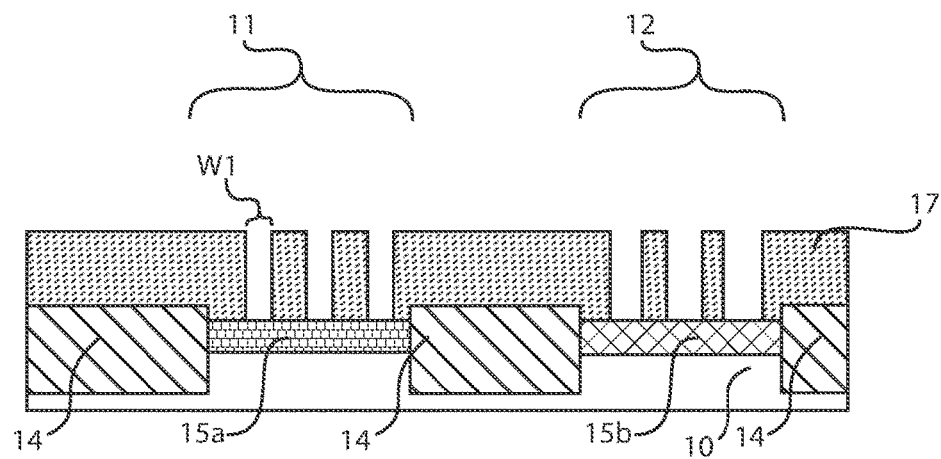
FIG. 3A is a side cross-sectional view depicting forming a first low-k spacer material on a first semiconductor material for a first of a source region and a drain region, and forming openings through the first low-k spacer material to provide fin structure openings to the first semiconductor material, in accordance with one embodiment of the present disclosure.

FIG. 3A depicts forming a low-k spacer material 16 (for the first spacer, i.e., first low-k spacer) atop the structure depicted in FIG. 2, e.g., on at least the semiconductor material of the drain regions 15a, 15b, and forming openings through the low-k spacer material to provide fin structure openings 17 to the semiconductor material of the drain regions 15a, 15b. The width of the fin structure openings 17 typically dictates the width of the epitaxial semiconductor channel material for the device. As used herein, the term "low-k" denotes a dielectric material having a dielectric constant equal to the dielectric constant of silicon oxide (SiO2) or less. The low-k dielectric spacers 16 typically have a dielectric constant that is less than 7.0, e.g., 5.5. In one embodiment, the low-k dielectric material has a dielectric constant ranging from 3.9 to 6. In another embodiment, the low-k dielectric material has a dielectric constant less than 3.9. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The low-k spacer material may be deposited using at least one of spin on deposition, chemical vapor deposition (CVD), plasma-assisted CVD, evaporation and chemical solution deposition.

Still referring to FIG. 3A, following the deposition of the low-k spacer material 16, the layer of low-k spacer material 16 may be patterned and etched to form the fin structure openings 17. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. Following formation of the patterned photoresist (also referred to as a photoresist etch mask), the exposed portions of the low-k spacer material may be etched. The etch process may be anisotropic, and typically is selective to the semiconductor material of the drain regions 15a, 15b. For example, the etch process for forming the fin structure openings 17 is a reactive ion etch process.

As noted above, in some embodiments, the width W1 of the fin structure openings 17 dictates the width of the later formed epitaxially formed semiconductor channel material for the device. In one embodiment, the width W1 of the fin structure openings 17 may be less than 20 nm. In some other embodiments, the width W1 of the fin structure openings 17 may range from 3 nm to 8 nm. In some embodiments, the width W1 of the fin structure openings 17 in the first device region 11 of the substrate is equal to the width W1 of the fin structure openings in the second region 12 of the substrate, as depicted in FIG. 3A.

Figure 3B:
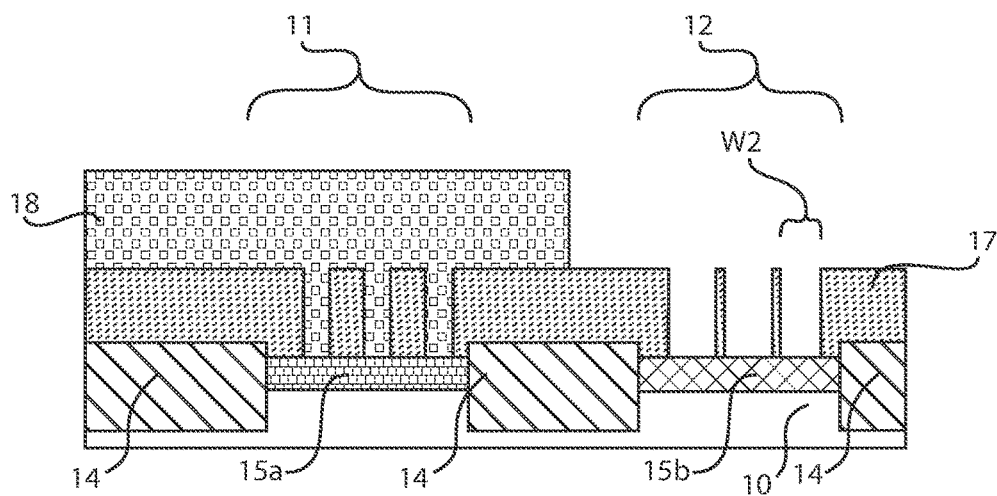
FIG. 3B is a side cross-sectional view of etching a first portion of the first low-k spacer material, while a second portion of the first low-k spacer material is protected by an etch mask before forming the conformally deposited inner spacer liner, in accordance with one embodiment of the present disclosure.

Referring to FIG. 3B, in some embodiments, the width W1 of the via openings 17 in the first region 11 of the substrate may be different from the width W2 of the via openings 17 in the second region 12 of the substrate. This can be provided by forming a block mask 18 over one region the substrate, e.g., first device region 11, and leaving a second region, e.g., second device region 12, of the substrate exposed; and then applying a lateral etch to the low-k dielectric spacer material 16 in the exposed region of the substrate. In some embodiments, the block mask 18 may be composed of photoresist that is formed using deposition, photolithography and development processes. More specifically, a layer of photoresist is deposited atop the entire structure. The photoresist layer may then selectively exposed to light and developed to pattern a block mask 18 protecting at least one first region, e.g., first device region 11, of the substrate and exposing at least one second region, e.g., second device region 12, of the substrate. The exposed regions of the device are then processed, while the regions underlying the block mask are protected. Following processing of the first region, the block mask 18 is removed by conventional stripping techniques. The width W2 of the via openings 17 in the second device region 12 may be increased using a lateral etch, such as a plasma etch, or wet chemical etch. It is noted that the process steps depicted in FIG. 3B are optional and may be omitted. The lateral etch step for increasing the width W2 of the fin openings 17 in the second device region 12 may range from 0.5 nm to 10 nm. The lateral etch step depicted in FIG. 3B is one example of how to modulate the width of the fin structures, i.e., width of epitaxial semiconductor channel material for the device.

Although three fin openings 17 are depicted in each of the first and second device regions 11, 12, the present disclosure is not limited to only this example. Any number of fin openings 17 may be present in each of the first and second device regions 11, 12. In some embodiments, the pitch P1 separating adjacent fin openings 17 may range from 10 nm to 50 nm. In yet another embodiment, the pitch separating adjacent fin openings 17 may range from 20 nm to 30 nm.

Figure 4:
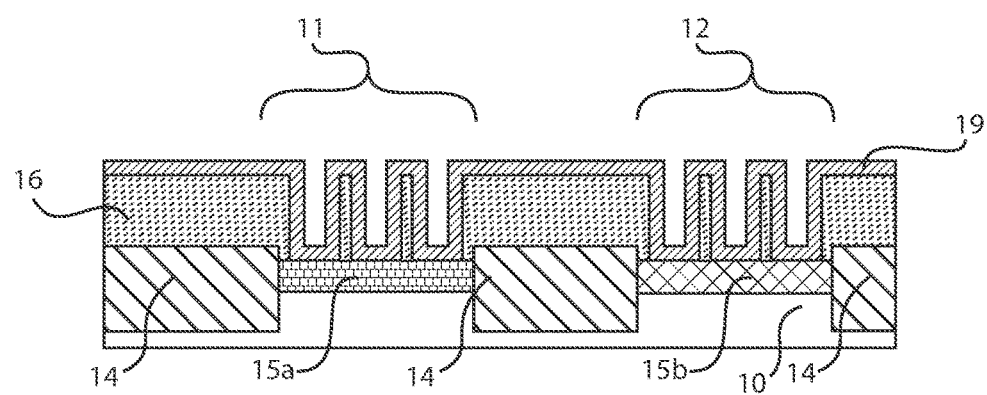
FIG. 4 is a side cross-sectional view depicting forming a conformally deposited inner spacer liner on at least the sidewalls of the fin structure openings, in accordance with one embodiment of the present disclosure.

FIG. 4 depicts forming a conformally deposited inner spacer liner 19 on at least the sidewalls of the fin structure openings. Although FIG. 4 depicts forming the inner spacer liner 19 on the structure depicted in FIG. 3A, this step of the process is equally applicable to the structure depicted in FIG. 3B, as well as the remaining process flow being equally applicable to each of the embodiments depicted in FIGS. 3A and 3B. The material of the conformally deposited inner spacer liner 19 is selected so that the material of the low-k spacer material 16 can be etched without removing the inner spacer liner 19, which will protect the subsequently formed fin structures, i.e., epitaxially formed semiconductor channel material, of the VFET. Any dielectric material can be selected for the inner spacer liner 19, so long as the material employed provides the above described etch selectivity. In some embodiments, when the low-k spacer material 16 is a low-k nitride, the inner spacer liner 19 is an oxide, such as silicon oxide. In other embodiments, the inner spacer liner 19 may be composed of amorphous carbon, as well as metal oxides and metal nitrides, e.g., hafnium oxide and titanium nitride.

The term "conformal layer" denotes a layer having a thickness that does not deviate from greater than or less than 30% of an average value for the thickness of the layer. To provide the conformal layer, the inner spacer liner 19 may be deposited using atomic layer deposition (ALD). In other embodiments, the inner spacer liner 19 may be deposited using chemical vapor deposition methods, such as plasma enhanced chemical vapor deposition (PECVD). In some embodiments, the thickness of the inner spacer liner 18 may range from 0.5 nm to 20 nm. In other embodiments, the thickness of the inner spacer liner 18 may range from 1 nm to 5 nm. Referring to FIG. 4, the conformally deposited inner spacer liner 19 is depicted as being formed on the upper surfaces of the low-k spacer material 16, the sidewall surfaces of the low-k spacer material 16 that provide the fin openings 17, and the exposed upper surfaces of the drain regions 15a, 15b that are present at the base of the fin openings 17.

Figure 5:
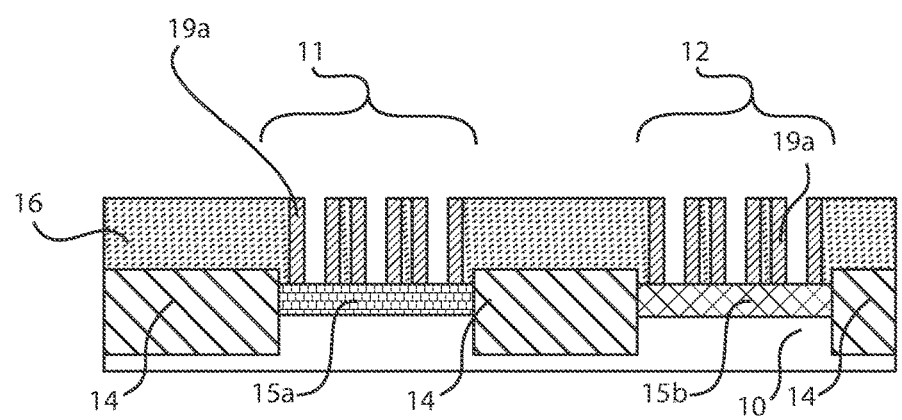
FIG. 5 is a side cross-sectional view depicting etching the conformally deposited inner spacer liner to remove the horizontally orientated portions and expose a portion of the first semiconductor material at a base of the fin structure openings, wherein a remaining vertical portion is present on sidewalls of the fin structure openings, in accordance with one embodiment of the present disclosure.

FIG. 5 depicts etching the conformally deposited inner spacer liner 19 to remove the horizontally orientated portions and expose a portion of the first semiconductor material, i.e., semiconductor material of the drain regions 15a, 15b, at a base of the fin structure openings 17. A remaining vertical portion is present on sidewalls of the fin structure openings 17, which provides an inner liner spacer 19a. The etch process for removing the horizontally orientated portions of the conformally deposited spacer liner 19 may be an anisotropic etch process, such as reactive ion etch (RIE). It is noted that the exposed portion of the drain regions 15a, 15b at the base of the fin structure openings 17 provides an epitaxial growth surface S1 for depositing epitaxial material, as further described below.

Figure 6A:
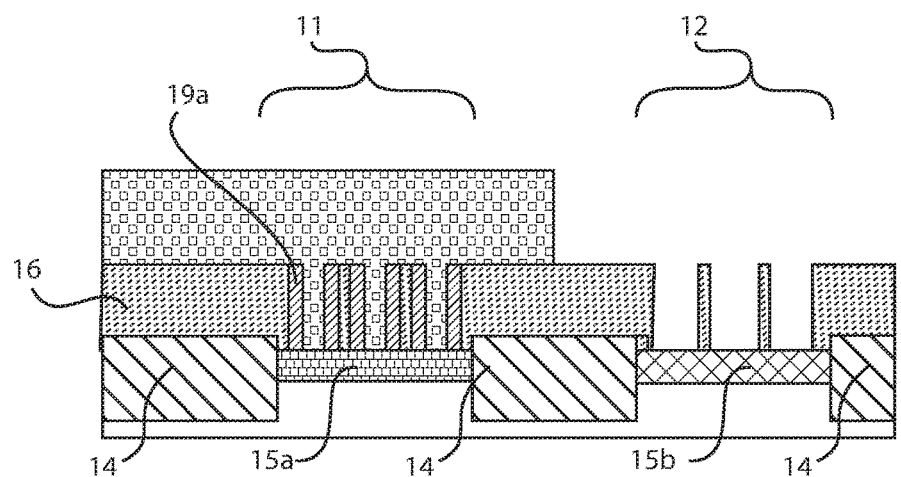
FIG. 6A is a side cross-sectional view depicting one embodiment of the present disclosure, in which the deposited inner spacer liner material is removed from one device region of the substrate, while a remainder of the spacer liner material is protected from being removed from a second device region of the substrate.
Figure 6B:
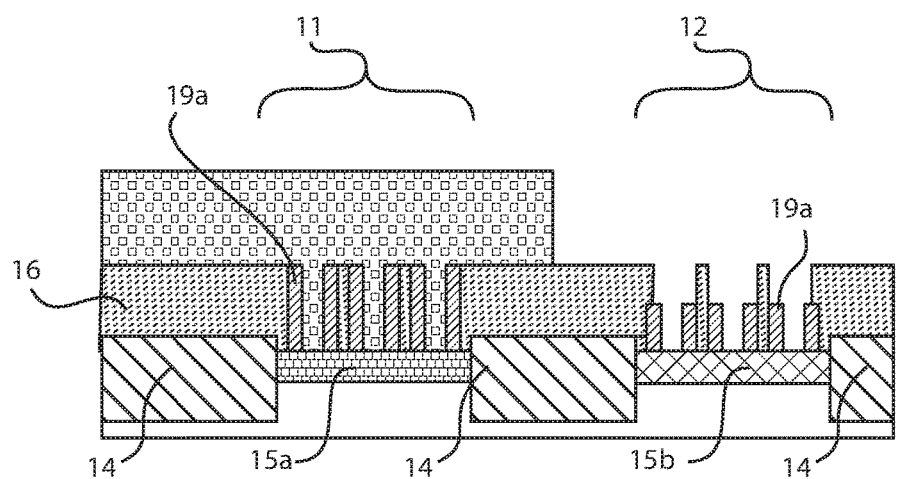
FIG. 6B is a side cross-sectional view depicting one embodiment of the present disclosure, in which the deposited inner spacer liner material is partially removed from one device region of the substrate, while a remainder of the spacer liner material is protected from being removed from a second region of the substrate.

FIGS. 6A and 6B depict some optional steps to the process flow in accordance with some embodiments of the present disclosure. It is noted that these embodiments illustrate some examples of modulating the width of the fin structures (Dfin), i.e., the width of epitaxial semiconductor channel material for the device. FIG. 6A depicts one embodiment of the present disclosure, in which the deposited inner spacer liner material 19 is removed from one region of the substrate, e.g., is removed from the second device region 11, while a remainder of the spacer liner material 19 is protected from being removed from a second region 12 of the substrate. In this embodiment, a block mask is formed over the first device region 11 of the substrate. The block mask employed may be similar to the block mask 18 that is described above with reference to FIG. 3B. Following the formation of the block mask 18 protecting the first device region 11, the entirety of the inner spacer liner material 19 is removed from the second device region 12 of the substrate. The inner spacer liner 19 may be removed from the second device region 12 with a selective etch process. By removing the inner spacer line material 19 from the second device region 12, the width of the fin structure openings 17 in the second device region 12 is greater than the width of the fin structure openings 17 in the first device region 11 that include the remaining portion of the spacer liner material 19. Therefore, the subsequently epitaxially formed fin structure, i.e., epitaxial semiconductor channel material for the device, that is formed in the second device region 12 will have a greater width than the subsequently epitaxially formed fin structure, i.e., epitaxial semiconductor channel material for the device, that is formed in the first device region 11.

FIG. 6B depicts another embodiment of the present disclosure, in which the deposited inner spacer liner material 19 is partially removed from one the second device region 12 of the substrate, while a remainder of the spacer liner material 19 is protected from being removed from a first device region 11 of the substrate. In this embodiment, a block mask is formed over the first device region 11 of the substrate. The block mask employed may be similar to the block mask 18 that is described above with reference to FIG. 3B. Following the formation of the block mask 18 protecting the first device region 11, the inner spacer liner material 19 in the second device region 12 of the substrate is recessed, i.e., an upper portion of the inner spacer liner material 19 is removed, while the lower portion of the inner spacer liner material 19 remains. The inner spacer liner 19 may be recessed with an anisotropic etch, such as reactive ion etch. By removing the upper portion of the inner spacer liner material 19 from the second device region 12, the upper width of the fin structure openings 17 in the second device region 12 is greater than the lower width of the fin structure openings 17 in the second device region 12. Therefore, the subsequently epitaxially formed fin structure, i.e., epitaxial semiconductor channel material for the device, that is formed in the second device region 12 will have a greater width in its upper portion than its lower portion.

Figure 7:
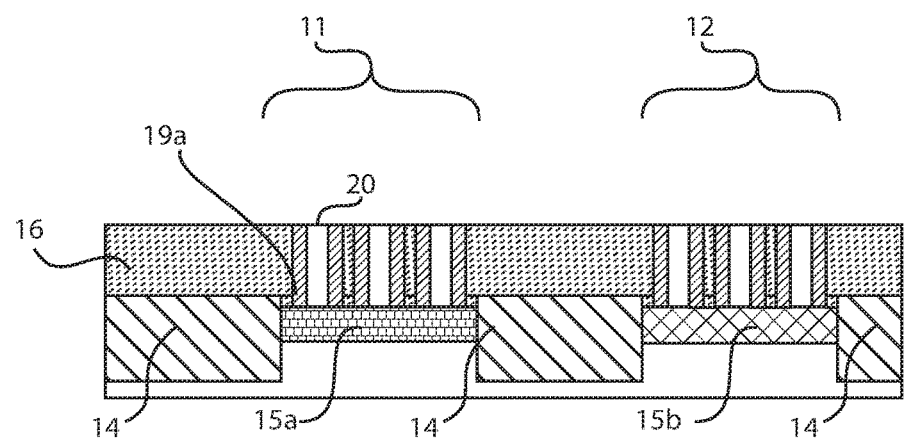
FIG. 7 is a side cross-sectional view depicting epitaxially forming channel semiconductor material on the surface of the first semiconductor material, in accordance with one embodiment of the present disclosure.

FIG. 7 depicting epitaxially forming channel semiconductor material 20, i.e., epitaxial fin structures, on the surface of the drain regions 15a, 15b. Although FIG. 7 depicts forming the channel semiconductor material 20 on the embodiment that is depicted in FIG. 5, the following description of forming the channel semiconductor material is equally applicable to the embodiments that are illustrated in FIGS. 6A and 6B. The channel semiconductor material 20 is typically composed of a type IV semiconductor. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. The channel semiconductor material may also be a compound semiconductor material. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures, i.e., epitaxially formed semiconductor channel material, include at least one of gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The channel semiconductor material 20 is typically intrinsic. It is noted that a different material may be used for the drain region 15a in the first device region 11 than the material used for the drain region 15b in the second device region 12. Additionally, different materials may be used for the drain regions 15a, 15b and the epitaxially formed semiconductor channel material 20.

The epitaxially formed semiconductor channel material 20 typically fills the openings defined by the space between the opposing sidewalls of the inner spacer liner material 19a, as depicted in FIG. 5. The epitaxially formed semiconductor channel material 20 may also fill the openings to the exposed surface of the drain regions 15a, 15 that provide the epitaxial deposition surface that is depicted in FIGS. 6A and 6B. In some embodiments, the method may further include a planarization process, such as chemical mechanical planarization (CMP), that is applied to the upper surfaces of the epitaxially formed semiconductor channel material 20 so that the upper surfaces of the epitaxially formed semiconductor channel material 20 is coplanar with the upper surfaces of the low-k dielectric material 16.

In some embodiments, the epitaxially formed semiconductor channel material 20 may have a height ranging from 5 nm to 200 nm. In another embodiment, the epitaxially formed semiconductor channel material 20 has a height ranging from 10 nm to 100 nm. In one embodiment, the epitaxially formed channel semiconductor material 20 has a width of less than 20 nm. In another embodiment, the epitaxially formed semiconductor channel material 20 has a width ranging from 3 nm to 8 nm. The pitch, i.e., center to center, dimension separating the adjacent epitaxially formed semiconductor channel material 20 in each of the first and second device regions 11, 12 may range from 10 nm to 50 nm.

Figure 8:
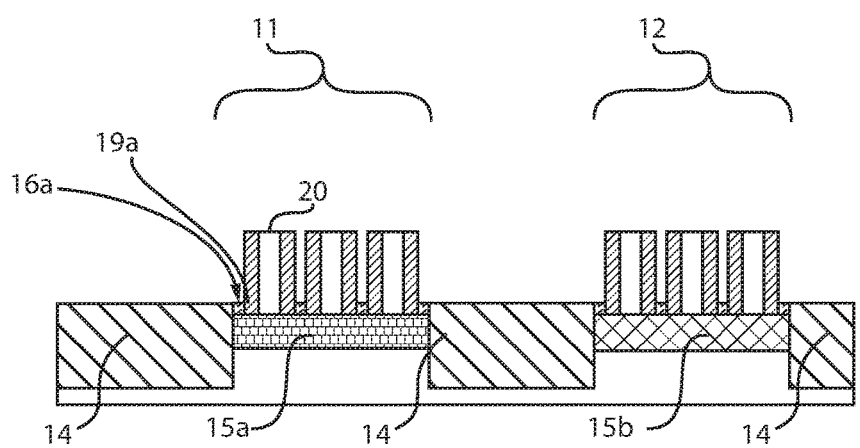
FIG. 8 is a side cross-sectional view depicting recessing the low-k spacer material with an etch that is selective to the inner spacer liner to form the first low-k spacer, in accordance with one embodiment of the present disclosure.

FIG. 8 depicting recessing the low-k spacer material 16 with an etch that is selective to the inner spacer liner material 19 to form the first low-k spacer 16a (also referred to as first spacer 16). Because the etch process for recessing the low-k spacer material 16 is selective to the inner spacer liner material 19, the epitaxially formed channel semiconductor material 20 is protected from the etch chemistry that is being applied to the low-k spacer material 16. In some embodiments, the etch process for recessing the low-k spacer material 16 is an anisotropic etch process, such as reactive ion etch, plasma etching, or laser etching. In other embodiments, the etch process for recessing the low-k spacer material 16 is an isotropic etch, such as a wet chemical etch.

As depicted in the embodiment that is illustrated in FIG. 8, the etch process for recessing the low-k spacer material 16 may continue until the only remaining portion of the low-k spacer material 16 fills the space between the upper surface of the drain region 15a, 15b and the upper surface of the isolation region 14. The remaining portion of the low-k spacer material 16 that is present in the aforementioned space may hereafter be referred to as the first low-k spacer 16. The etch process for forming the first low-k spacer 16a may expose the upper surface of the isolation region 14. In some embodiments, the etch process for recessing the low-k spacer material 16 is timed. In other embodiments, end point detection may be employed for determining the time to terminate the etch process. The first low-k spacer 16a may have height ranging from 3 nm to 20 nm.

Figure 9A:
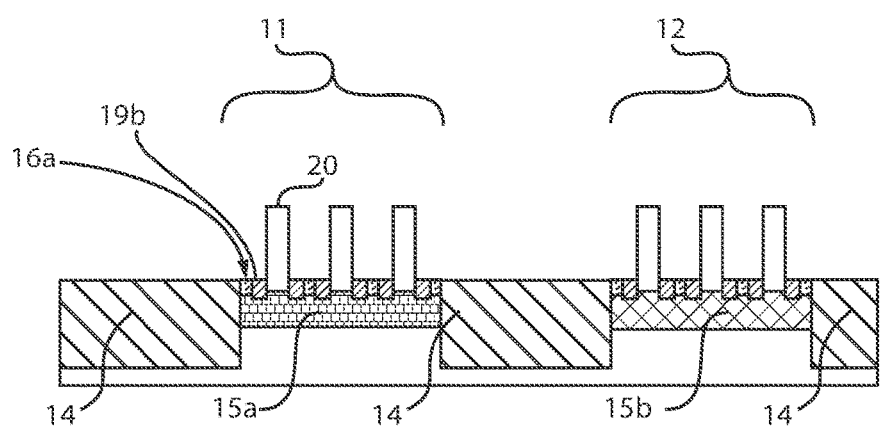
FIG. 9A is a side cross-sectional view depicting removing a portion of the inner spacer liner selectively to the channel semiconductor material, in accordance with one embodiment of the present disclosure.
Figure 9B:
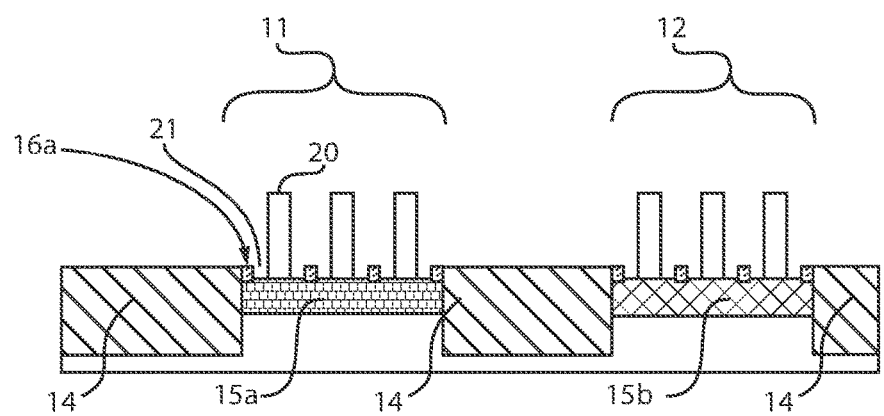
FIG. 9B is a side cross-sectional view depicting removing an entirety of the inner spacer liner selectively to the channel semiconductor material, in accordance with one embodiment of the present disclosure.

Following recessing the low-k spacer material to provide the first low-k spacer 16a, the inner spacer liner material may be etched to expose the channel portion of the epitaxially formed semiconductor channel material 20 that the gate structure is to be formed on. In one embodiment, only a portion of the inner spacer liner material 19a is etched selectively to the epitaxially formed semiconductor channel material 20, wherein a remaining portion of the inner spacer liner material 19a is present between the first low-k spacer 16 and the epitaxially formed semiconductor channel material 20, as depicted in FIG. 9A. The remaining portion of the inner spacer liner material 19a typically has an upper surface that is coplanar with the upper surface of the isolation regions 14, as well as the upper surface of the first low-k spacer 16. In some embodiments, the inner spacer liner material 19a may be removed in its entirety leaving a gap between the first low-k spacer 16 and the epitaxially formed semiconductor channel material 20, as depicted in FIG. 9B. The inner spacer liner material 19a may be etched using an anisotropic etch, such as reactive ion etch (RIE), or an isotropic etch, such as a wet chemical etch. The following process sequence employs the structure depicted in FIG. 9A, in which a remaining portion of the inner spacer liner material 19a is present between the first low-k spacer 16 and the epitaxially formed semiconductor channel material 20. The following process sequence may be equally applied to the structure provided by the embodiments depicted in FIG. 9B, in which when the later described gate dielectric/work function metal stack 22 and/or gate conductor 23 are formed, an air gap is enclosed between the first low-k spacer 16 and the epitaxially formed semiconductor material 20. In another embodiment, the process sequence applied to the embodiment in FIG. 9B can provide that the gap left is filled with high-k dielectric from the subsequently deposited gate stack. This can be leveraged to increase gate fringing field coupling to the under-spacer component of the bottom source/drain junction.

Figure 10:
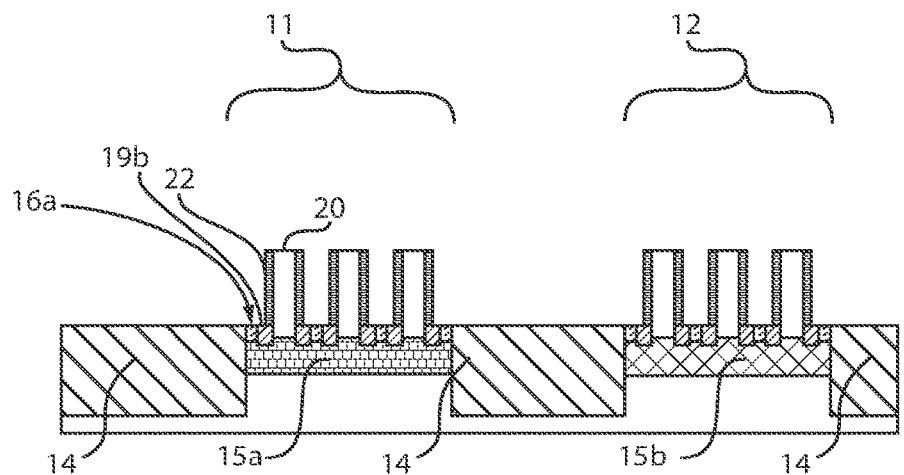
FIG. 10 is a side cross-sectional view depicting forming a gate dielectric and work function metal stack on the channel semiconductor material, in accordance with one embodiment of the present disclosure.

FIG. 10 depicts forming a gate dielectric and work function metal, illustrated as gate dielectric/work function metal stack 22, on the channel portion of the epitaxially formed semiconductor channel material 20 of the structure depicted in FIG. 9A. It is noted that the process step depicted in FIG. 10 is equally applicable to the embodiment that is depicted in FIG. 9B.

The gate dielectric of the gate dielectric/work function metal stack 22 is first formed on the channel portion of the epitaxially formed semiconductor channel material 20. Typically, the gate dielectric is formed using a conformal deposition process. The gate dielectric may be composed of any dielectric material, such as an oxide, nitride or oxynitride material. In some embodiments, the gate dielectric is a high-k dielectric material. As used herein, "high-k" denotes a dielectric material featuring a dielectric constant (k) higher than the dielectric constant of $SiO_2$ at room temperature. For example, the least one gate dielectric layer may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric include hafnium silicate, hafnium silicon oxynitride or combinations thereof.

To provide the conformal layer, the gate dielectric may be deposited using atomic layer deposition (ALD). In other embodiments, the gate dielectric may be deposited using chemical vapor deposition methods, such as plasma enhanced chemical vapor deposition (PECVD). In one embodiment, the thickness of the at least one gate dielectric layer is greater than 0.8 nm. More typically, the at least one gate dielectric layer has a thickness ranging from about 1.0 nm to about 6.0 nm.

In some embodiments, conformal deposition of the gate dielectric produces a vertical portion on the channel portion of the epitaxially formed semiconductor channel material 20, and a horizontal portion that is present on the upper surfaces of the remaining portion of the inner spacer liner 19a (when present), the first low-k spacer 16b, and the isolation regions 14. The horizontal portions may be removed by an etch process, such as reactive ion etch.

Following formation of the gate dielectric, the work function metal may be deposited. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

The n-type and p-type work function metal layers may be selectively deposited into the first device region 11 and the second device region 12 using block masks. For example, an n-type work function metal layer may be formed in the first device region 11 for n-type semiconductor devices, and a p-type work function metal layer may be formed in the second device region 12 for p-type semiconductor devices. The n-type and p-type work function metal layers may be deposited using a conformal deposition process. Similar to the gate dielectric, depositing the n-type and p-type work function metal layers may provide vertical portions on the gate dielectric that is present on the channel portion of the epitaxially formed semiconductor channel material 20, and a horizontal portion that is overlying the upper surfaces of the remaining portion of the inner spacer liner 19a (when present), the first low-k spacer 16b, and the isolation regions 14. The horizontal portions may be removed by an etch process, such as reactive ion etch.

In various embodiments, the gate dielectric/work function metal stack 22 may have a thickness, i.e., width measured from the sidewall of the epitaxially formed semiconductor channel material 20, of less than about 15 nm. In another embodiment, the gate dielectric/work function metal stack 22 may have a thickness, i.e., width measured from the sidewall of the epitaxially formed semiconductor channel material 20, in the range of about 7 nm to about 10 nm, or a thickness of about 7 nm.

Although not depicted in FIG. 10, in some embodiments, the high-k/metal-gate (HKMG) stack 22 is not formed on only the sidewalls of the fins, but may cover the top of the fins, i.e., epitaxially formed semiconductor channel material 20. As the process sequence continues from FIG. 10 to FIG. 11, the low-k spacer material fills the remaining gaps and the structure is planarized to the upper surface of the fins, at which point the HKMG stack 22 is removed from the upper surfaces of the fins, and only covers the sidewalls.

Figure 11:
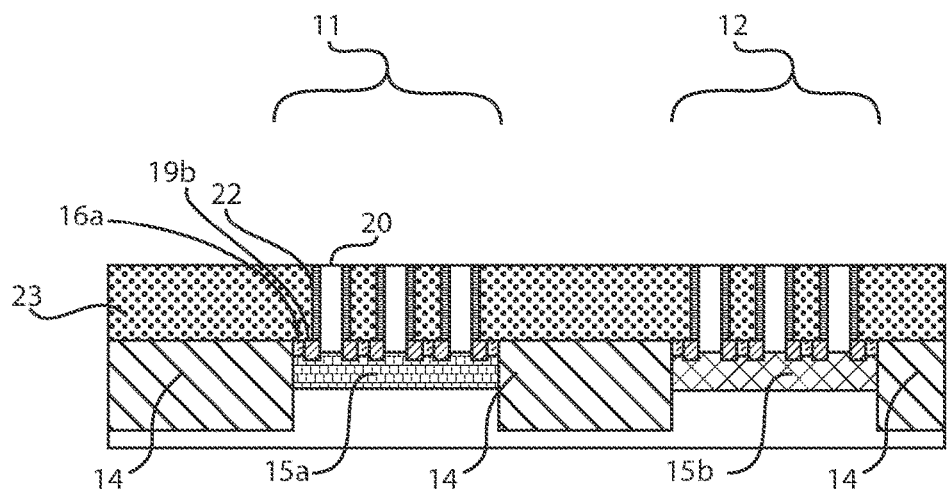
FIG. 11 is a side cross-sectional view depicting forming a gate conductor on the gate dielectric and work function metal stack that is depicted in FIG. 10.

FIG. 11 depicts forming a gate conductor 23 on the gate dielectric/work function metal stack 22. The gate conductor 23 may be blanket deposited filling the space between the adjacent fin structures, i.e., the space between the adjacent combinations of epitaxially formed semiconductor channel material 20 and the gate dielectric/metal work function stack 22. In various embodiments, the gate conductor 23 is a metal, where the metal may be tungsten (W), tungsten nitride (WN) or combinations thereof. In one or more embodiments, the gate conductor 23 is tungsten (W). The gate conductor 23 may be deposited by CVD or PE-CVD. Planarization including chemical mechanical planarization may be employed so that the upper surface of the gate conductor 23 is coplanar with the upper surface of the epitaxially formed semiconductor channel material 20. The planarization process may expose a surface of the epitaxially formed semiconductor channel material 20 that can provide the epitaxial growth surface for the source regions of the device.

Figure 12:
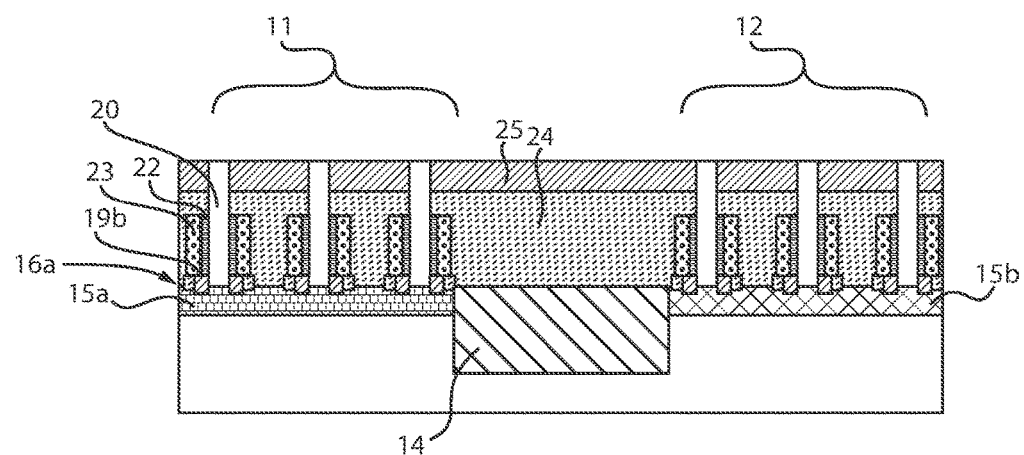
FIG. 12 is a side cross-sectional view depicting forming a second spacer, e.g., second low-k spacer, on the structure depicted in FIG. 11, in accordance with one embodiment of the present disclosure.

FIG. 12 is a side cross-sectional view depicting patterning the gate conductor 23, and forming a top spacer, i.e., a second spacer, e.g., second low-k spacer. Patterning the gate conductor 23 may begin with recessing the gate conductor 23 to a depth below the upper surface of the epitaxially formed semiconductor channel material 20. This etch step may be performed using reactive ion etch. Thereafter, a disposable spacer (not shown) is formed on the exposed ends of the epitaxially formed semiconductor channel material 20. The disposable spacer material may be a thin conformal oxide or nitride layer (e.g., $SiO_2$, SiN). In various embodiments, the disposable spacer may be formed by an ALD or PE-ALD process. The thickness of the disposable spacer material at least on the sidewalls of the epitaxially formed semiconductor channel material 20 can be sufficient to extend past the thickness of the gate dielectric/metal work function stack 22 to define the thickness of the gate conductor 23.

In one or more embodiments, the portion of the material layer for the gate conductor 23 that is exposed between the disposable spacer may be removed, for example by RIE, to form define the final dimension for the gate conductor 23 of the gate structures. In some embodiments, the gate conductor 23 may have a thickness in the range of about 2 nm to about 5 nm, or in the range of about 2 nm to about 3 nm. Following patterning of the gate conductor, the disposable spacer may be removed to expose the distal end portion of the epitaxially formed semiconductor material 20, where the disposable spacer may be removed by etching. The gate conductor 23 and the gate dielectric/metal work function stack 22 form a gate structure with the channel portion of the epitaxially formed semiconductor channel material 20 for control of current through the epitaxially formed semiconductor channel material 20, where the gate structure may be on four sides and surround the epitaxially formed semiconductor channel material 20.

In various embodiments, a second low-k dielectric material 24 may be formed in the spaces between the gate conductors 23. The second low-k dielectric material 24 may be subsequently processed to provide the second spacer, e.g., second low-k spacer. In various embodiments, the second low-k dielectric material 24 may be the same as the first low-k dielectric material 16 described above with reference to FIGS. 3A and 3B. Therefore, the above description of the first low-k dielectric material 16 is suitable for the second low-k dielectric material 24. The second low-k dielectric material 24 may be an oxide. The second low-k dielectric material 24 may be deposited using a chemical vapor deposition process, such as plasma enhanced chemical vapor deposition (PECVD). In other examples, the second low-k dielectric material 24 may be deposited using chemical solution deposition or spin on deposition. In some embodiments, the height of the second low-k dielectric material 24 may be reduced to expose a portion of the distal end of the epitaxially formed semiconductor channel material 20. The height of the second low-k dielectric material 24 may be reduced by etching, such as reactive ion etching (RIE).

An inter-layer dielectric (ILD) material layer 26 may be formed over the distal end of the epitaxially formed semiconductor channel material 20 to provide electrical insulation between the epitaxially formed semiconductor channel material 20. In various embodiments, the inter-layer dielectric is $SiO_2$. In various other embodiments, the inter-layer dielectric is $Si_3N_4$. A portion of the inter-layer dielectric (ILD) material layer 75 may be removed by chemical-mechanical polishing to provide a flat, uniform surface, where the top surface of the inter-layer dielectric (ILD) material layer 26 may be coplanar with the tops of the epitaxially formed semiconductor channel material 20. In various embodiments, the ILD material is different from the material of the second low-k dielectric material 24.

Figure 13:
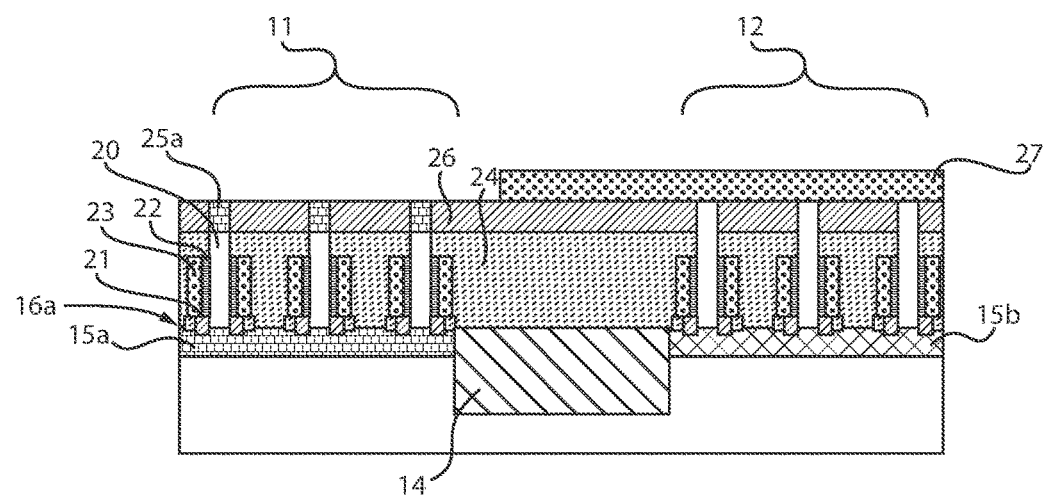
FIG. 13 is a side cross-sectional view depicting forming an etch mask over the second region of the substrate, and forming a first conductivity type of a second of a source region and a drain region in connection with the channel semiconductor material in the first region of the substrate, in accordance with one embodiment of the present disclosure.

FIG. 13 depicts forming an etch mask 27 over the second region 12 of the substrate, and forming a first conductivity type of a second of a source region and a drain region in connection with the channel semiconductor material in the first region 11 of the substrate. It is noted that in the embodiments described above with respect to FIGS. 1-12, the drain regions 15, 15b have been formed prior to this stage of the process flow. Therefore, in these embodiments, first conductivity type source regions 25a are formed at this step of the process flow. Embodiments have been contemplated in which the order of the formation of the source and drain regions in the first and second device regions 11, 12 may be switched so that at least one source regions is formed before at least one of the drain regions.

The etch mask 27 depicted in FIG. 13 is similar to the block mask 18 that has been described above with reference to FIG. 3B. Therefore, the description of the block mask 18 depicted in FIG. 3B is suitable to describe the etch mask 27 that is depicted in FIG. 13. Following formation of the etch mask 27 overlying the second device region 12, the exposed tops of the epitaxially formed semiconductor channel material 20 may be etched to reduce the height of the fin channels. The etch process for recessing the epitaxially formed semiconductor channel material 20 may be reactive ion etch.

A source material may be formed in the openings produced by recessing the epitaxially formed semiconductor channel material 20 in the first device region 11 to form first source regions 25a. In various embodiments, the first source regions 25a may be epitaxially grown on the top surface of the epitaxially formed semiconductor channel material 20, where the first source regions 25a may have the same crystal structure and orientation as the underlying epitaxially formed semiconductor channel material 20. The first source regions 25a may be composed of Si, SiGe, SiC, or SiP. The first source regions 25a are doped with an n-type or p-type dopant. For example, in some embodiments, in which the first device region 11 includes n-type conductivity device, the first source regions 25a may be doped to an n-type conductivity.

Growth of the source material for the first source regions 25a may be done as a single layer or as multiple deposited layers having varying dopant levels. In various embodiments, the first source region 25a have the same doping as the first drain region 15a. The first source region 15a on each of the fin channels 750 associated with the first drain 400 have the same crystal orientation as the first bottom surface 190 to provide predetermined electrical properties (e.g., carrier mobility). It is noted that the epitaxial deposition process for forming the first source regions 25a is similar to the epitaxial deposition process for forming the above described drain regions 15a, 15b. Therefore, the above description of epitaxial deposition for forming the drain regions 15a, 15b can be suitable for describing the epitaxial deposition process for forming the first source regions 25a.

Figure 14:
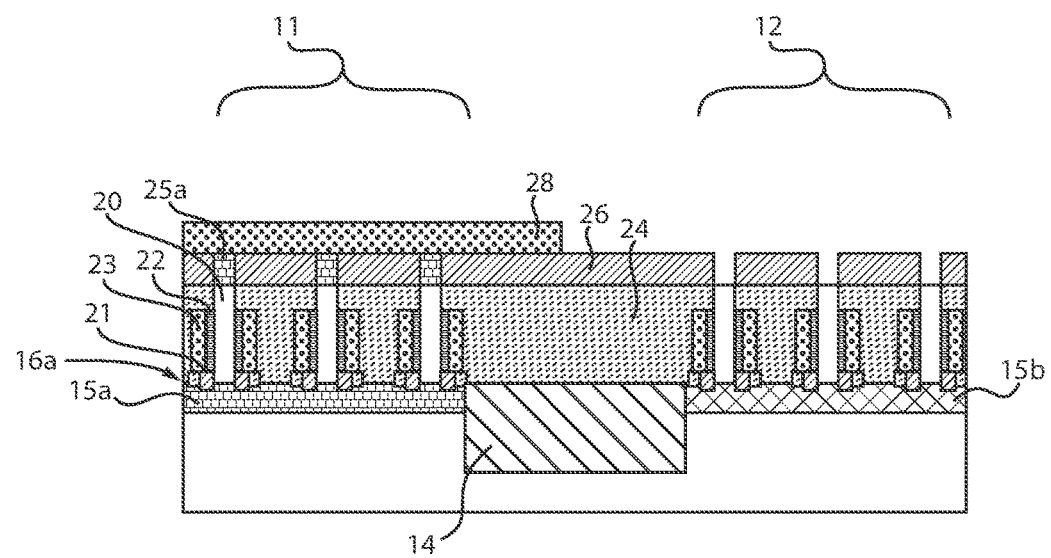
FIG. 14 is a side cross-sectional view depicting forming an etch mask over the second region of the substrate, in accordance with one embodiment of the present disclosure.

Following formation of the first source regions 25a in the first device region 11, the etch mask 27 that is present over the second device region 12 is removed. The etch mask 27 may be removed using selective etching or chemical stripping. Following removal of the etch mask 27 from the second device region 12, another etch mask 28 over the first device region 11, as depicted in FIG. 14. The etch mask 28 that is formed over the first device region 11 is similar in composition and method of formation as the etch mask 27 depicted in FIG. 13.

In a following process step, the epitaxially formed semiconductor channel material 20 that is present in the second device region 12 may be recessed using an etch that is selective to the etch mask 28 and the interlevel dielectric layer 26. The exposed tops of the epitaxially formed semiconductor channel material 20 that are present in the second device region 12 may be etched to reduce the height of the fin channels, as depicted in FIG. 14.

Figure 15A:
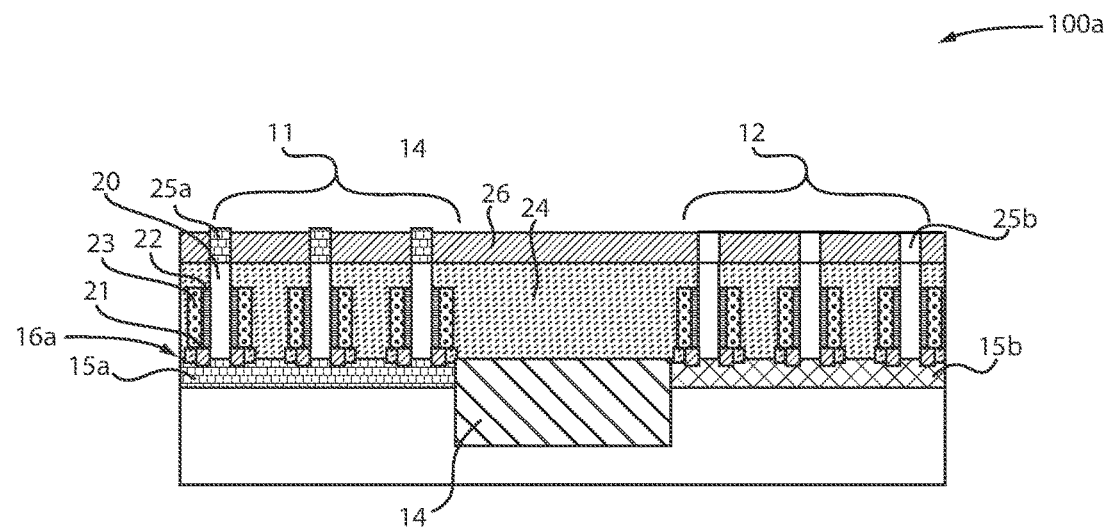
FIG. 15A is a side cross-sectional view depicting forming a second conductivity type of a second of a source region and a drain region in connection with the channel semiconductor material in the second region of the substrate to provide one embodiment of a vertical FET semiconductor device, in accordance with the present disclosure.
Figure 15B:
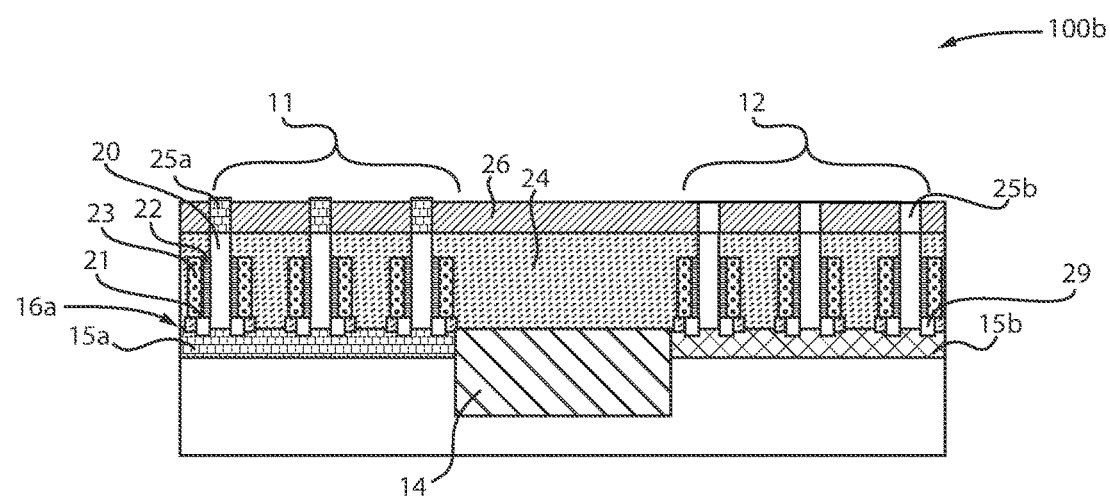
FIG. 15B is a side cross-sectional view depicting a vertical FET semiconductor device including an air gap is enclosed between a first low-k spacer and epitaxially formed semiconductor material that provides the channel region of the device, in accordance with one embodiment of the present disclosure.

Referring to FIG. 15A, a source material may be formed in the openings that are produced by recessing the epitaxially formed semiconductor channel material 20 in the second device region 12 to form second source regions 25b. In various embodiments, the second source regions 25b may be epitaxially grown on the top surface of the epitaxially formed semiconductor channel material 20, i.e., fin channel(s), where second sources regions 25b may have the same crystal structure and orientation as the underlying epitaxially formed semiconductor channel material 20. The second source region 25b may be Si, SiGe, SiC, or SiP, where the second source may be doped with boron, phosphorus, or carbon.

The second source regions 25b may be doped with an n-type or p-type dopant. For example, in some embodiments, in which the second device region 12 includes at least one p-type conductivity device, the second source regions 25a may be doped to a p-type conductivity. Growth of the source material may be done as a single layer or as multiple deposited layers having varying dopant levels. In one or more embodiments, the material of the second source regions 25b is different than the material of the first source regions 25a. It is noted that the epitaxial deposition process for forming the second source regions 25b is similar to the epitaxial deposition process for forming the above described drain regions 15a, 15b. Therefore, the above description of epitaxial deposition for forming the drain regions 15a, 15b can be suitable for describing the epitaxial deposition process for forming the second source regions 25b.

Referring to FIG. 15A, in one embodiment, a vertical semiconductor device 100a is provided that includes a first semiconductor material for a first of a source region and a drain region and an epitaxial fin channel 20 atop a first channel interface portion of a surface the first semiconductor material. In the embodiment that is depicted in FIG. 15A, a plurality of first drain regions 15a having a first conductivity, e.g., n-type conductivity, is present in the first device region 11, and a plurality of second drain regions 15b having a second conductivity type, e.g., p-type conductivity, is present in the second device region 12. In this example, a complimentary pair of FETs have been formed in the first device and second device regions 11, 12. Gates for each complimentary pair of FETs may be electrically coupled. Corresponding finFETs may be coupled to form a complementary metal oxide semiconductor (CMOS) transistor.

Referring to FIG. 15A a first spacer 16a, 21 contacts the surface of the first semiconductor material, wherein the first spacer comprises a low-k portion 16a and an inner spacer portion 21, the inner spacer present between the low-k portion 16a and the epitaxial fin channel, i.e., epitaxially formed semiconductor channel material 20. A gate structure 22, 23 is present atop the first spacer 16a, 21 and is in direct contact with the epitaxial fin channel, i.e., epitaxially formed semiconductor channel material 20. A second spacer 24 is formed atop the gate structure 22, 23, wherein a portion the epitaxial fin channel is exposed by the second spacer 24 to provide a second channel interface portion. A second semiconductor material for a second of the source region and the drain region is formed atop the second spacer and is in contact with the second channel interface portion of the epitaxial fin channel. In the embodiment that is depicted in FIG. 15A, a plurality of first source regions 25a having a first conductivity, e.g., n-type conductivity, are present in the first device region 11, and a plurality of second source regions 25b having a second conductivity type, e.g., p-type conductivity, is present in the second device region 12. The embodiment depicted in FIG. 15A includes a remaining portion of the inner spacer material 21, as described by the process flow consistent with the embodiment described above with reference to FIG. 9A.

In another embodiment, a vertical FET semiconductor device 100B is provided that includes an air gap 29 that is enclosed between a first low-k spacer 16a and the epitaxially formed semiconductor material 20, i.e., fin structure, that provides the channel region of the device. The air gap 29 is formed by removing the entirety of the low-k dielectric material 16, as described above with reference to FIG. 9B, to produce a void between the remaining portion of the first low-k spacer 16a and the epitaxially formed semiconductor material 20, and enclosing the void by forming the gate structure 22, 23 and depositing the material for the second spacer 24. The remainder of the features having reference numbers in the structure depicted in FIG. 9B have been described above. In yet another embodiment, the air gap space is filled with high-k material from the gate stack formation.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical semiconductor device comprising:
   a first semiconductor material for a first of one of a source region and a drain region and an epitaxial fin channel atop a first channel interface portion of a surface the first semiconductor material;
   an isolation region adjacent to the first semiconductor material;
   a first spacer contacting a surface of the first semiconductor material, wherein the first spacer comprises an outer spacer portion and an inner spacer portion, wherein the inner spacer portion is present between the outer spacer portion and the epitaxial fin channel, wherein the first spacer does not extend over the isolation region that is adjacent to the first semiconductor material;
   a gate structure present atop the first spacer and is in direct contact with the epitaxial fin channel; and
   a second semiconductor material for a second of one of the source region and the drain in contact with a second channel interface portion of the epitaxial fin channel.

2. The vertical semiconductor device of claim 1 further comprising a second spacer present atop the gate structure, wherein a portion the epitaxial fin channel is exposed by the second spacer to provide the second channel interface portion.

3. The vertical semiconductor device of claim 1, wherein an upper surface of the first spacer is substantially coplanar with an upper surface of the isolation region adjacent to the vertical semiconductor device.

4. The vertical semiconductor device of claim 1, wherein the first semiconductor material and the second semiconductor material are in an epitaxial relationship with the epitaxial fin channel.

5. The vertical semiconductor device of claim 1, wherein the gate structure comprises a gate dielectric and a gate electrode.

6. The vertical semiconductor device of claim 1, wherein the first semiconductor material is doped with an n-type or p-type dopant.

7. The vertical semiconductor device of claim 6, wherein the second semiconductor material is doped with an n-type or p-type dopant that is opposite conductivity type the first semiconductor material.

8. The vertical semiconductor device of claim 1, wherein the gate structure comprises a gate dielectric and an n-type work function metal.

9. The vertical semiconductor device of claim 1, wherein the gate structure comprises a gate dielectric and a p-type work function metal.

10. A vertical semiconductor device comprising:
    a first semiconductor material for a first of one of a source region and a drain region and an epitaxial fin channel atop a first channel interface portion of a surface the first semiconductor material;
    a first spacer contacting a surface of the first semiconductor material, wherein the first spacer comprises an outer spacer portion and an air gap, wherein the air gap is present between the outer spacer portion and the epitaxial fin channel;
    a gate structure present atop the first spacer and is in direct contact with the epitaxial fin channel; and
    a second semiconductor material for a second of one of the source region and the drain in contact with a second channel interface portion of the epitaxial fin channel.

11. The vertical semiconductor device of claim 10 further comprising a second spacer present atop the gate structure, wherein a portion the epitaxial fin channel is exposed by the second spacer to provide the second channel interface portion.

12. The vertical semiconductor device of claim 10, wherein an upper surface of the first spacer is substantially coplanar with an upper surface of an isolation region adjacent to the vertical field effect transistor.

13. The vertical semiconductor device of claim 10, wherein the first semiconductor material and the second semiconductor material are in an epitaxial relationship with the epitaxial fin channel.

14. The vertical semiconductor device of claim 10, wherein the gate structure comprises a gate dielectric, a metal work function adjusting layer and a gate electrode, the air gap filled with material from said gate dielectric.

15. The vertical semiconductor device of claim 10, wherein the first semiconductor material is doped with an n-type or p-type dopant.

16. The vertical semiconductor device of claim 15, wherein the second semiconductor material is doped with an n-type or p-type dopant that is opposite conductivity type the first semiconductor material.

17. The vertical semiconductor device of claim 10, wherein the gate structure comprises a gate dielectric and an n-type work function metal.

18. The vertical semiconductor device of claim 10, wherein the gate structure comprises a gate dielectric and a p-type work function metal.

19. A semiconductor device comprising:
    a first semiconductor material for a first of a source region and a drain region and an epitaxial fin channel atop a first channel interface portion of a surface the first semiconductor material;
    an isolation region adjacent to the first semiconductor material;
    a first spacer contacting a surface of the first semiconductor material, wherein the first spacer comprises an outer spacer portion and an inner spacer portion, wherein the inner spacer portion is present between the outer spacer portion and the epitaxial fin channel, wherein the first spacer does not extend over the isolation region that is adjacent to the first semiconductor material; and a second semiconductor material for a second of the source region and the drain in contact with a second channel interface portion of the epitaxial fin channel.

20. The vertical semiconductor device of claim 19 further comprising a second spacer present atop a gate structure that is present atop the first spacer and is in direct contact with the epitaxial fin channel, wherein a portion the epitaxial fin channel is exposed by the second spacer to provide the second channel interface portion.

* * * * *